(12) United States Patent
Matsuki et al.

(10) Patent No.: US 8,309,433 B2
(45) Date of Patent: Nov. 13, 2012

(54) METHOD OF MANUFACTURING OPTICAL SENSOR

(75) Inventors: Yasuhiro Matsuki, Atsugi (JP); Takanori Suzuki, Tokyo (JP); Koji Tsuduki, Kawasaki (JP); Shin Hasegawa, Hadano (JP); Tadashi Kosaka, Atsugi (JP); Akiya Nakayama, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/211,161

(22) Filed: Aug. 16, 2011

(65) Prior Publication Data

US 2012/0052612 A1 Mar. 1, 2012

(30) Foreign Application Priority Data

Aug. 27, 2010 (JP) ................................. 2010-191323

(51) Int. Cl.
*H01L 21/30* (2006.01)

(52) U.S. Cl. ... 438/458; 257/82; 257/432; 257/E21.238; 257/E21.499; 257/E27.133; 257/E31.097; 438/113; 438/116; 438/456; 438/457

(58) Field of Classification Search ........... 257/E21.238, 257/E21.499, E27.133, E31.097, 82, 432; 438/113, 116, 455, 456, 457, 458
See application file for complete search history.

(56) References Cited

U.S. PATENT DOCUMENTS

2009/0294779 A1* 12/2009 Ida et al. ................... 257/82

FOREIGN PATENT DOCUMENTS

| JP | 2006-147864 A | 6/2006 |
| JP | 2010-056319 A | 3/2010 |

* cited by examiner

*Primary Examiner* — Asok Sarkar
(74) *Attorney, Agent, or Firm* — Canon U.S.A., Inc. IP Division

(57) ABSTRACT

A method of manufacturing an optical sensor includes the steps of providing a semiconductor wafer having a plurality of pixel areas; forming a grid-like rib enclosing each pixel area on the semiconductor wafer, the grid-like rib having a predetermined width and being formed from a fixing member; providing a light-transmissive substrate having a gap portion on a main surface thereof, the gap portion having at least one of a groove having a width smaller than the grid-like rib and a plurality of through-holes; fixing the semiconductor wafer and the light-transmissive substrate such that the grid-like rib and the gap portion face each other; and cutting the fixed semiconductor wafer and light-transmissive substrate into pieces such that each piece includes one pixel area.

6 Claims, 9 Drawing Sheets

METHOD OF MANUFACTURING OPTICAL SENSOR

BACKGROUND OF THE INVENTION

1. Field of the Invention

The present invention relates to a method of manufacturing optical sensors.

2. Description of the Related Art

Optical sensors manufactured by a wafer level chip size package (WLCSP) process are known. An optical sensor manufactured by the WLCSP process is obtained by fixing a wafer-state semiconductor substrate including image pickup devices and a light transmissive substrate together and dividing the fixed substrates into individual chips. Japanese Patent Laid-Open No. 2006-147864 discloses a structure and method of manufacturing wafer level chip size packages (WLCSPs) that contribute to a reduction in size of optical sensors.

Japanese Patent Laid-Open No. 2010-056319 discloses a method in which a groove of about 150 μm is formed in a resin layer between dicing portions and image pickup devices to reduce warping of WLCSPs, in the wafer level, due to the difference in coefficient of linear expansion and reduce warping after the wafer is divided into pieces.

In the above-described method of manufacturing optical sensors, a semiconductor wafer and a light-transmissive substrate are fixed to each other with a fixing member. However, it has been difficult to suppress bubbles generated between the fixing member and the light-transmissive substrate after the wafer and the substrate are fixed. The bubbles decrease the bonding strength of bonding surfaces when heated in the subsequent step and decrease the yield because of separation of the semiconductor wafer and the light-transmissive member. Furthermore, even after the integrated wafer and substrate are divided into pieces, because the bubbles remaining between the adhesive layer and the glass substrate degrade the air-tightness of the semiconductor devices, the reliability of the semiconductor devices is decreased.

SUMMARY OF THE INVENTION

A method of manufacturing optical sensors includes the steps of providing a semiconductor wafer having a plurality of pixel areas; forming a grid-like rib enclosing each pixel area on the semiconductor wafer and being made from a fixing member; providing a light-transmissive substrate having a gap portion on a main surface, the gap portion having at least one of a groove having a smaller width than the grid-like rib and a plurality of through-holes; fixing the semiconductor wafer and the light-transmissive substrate such that the grid-like rib and the gap portion face each other; and cutting the fixed semiconductor wafer and light-transmissive substrate into pieces such that each piece includes one pixel area.

Further features of the present invention will become apparent from the following description of exemplary embodiments with reference to the attached drawings.

DESCRIPTION OF THE EMBODIMENTS

In the present invention, in order to provide an airflow path in a fixing member for fixing a light-transmissive substrate to a semiconductor wafer, the semiconductor wafer is fixed to the light-transmissive substrate such that a grid-like rib formed on a fixing member and a grid-like gap portion formed on the light-transmissive substrate face each other. The gap portion of the light-transmissive substrate includes at least one of a grid-like groove and a plurality of through-holes arranged in a grid-like manner.

Embodiments of the present invention will be described with reference to FIGS. 1A to 9B.

First Embodiment

Figure 1A:
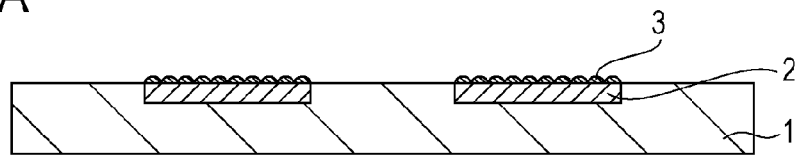
FIGS. 1A to 1D are cross-sectional views showing the process of manufacturing optical sensors according to a first embodiment.
Figure 1B:
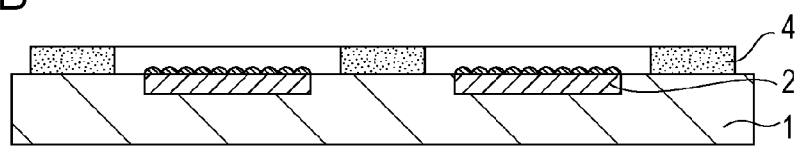

Referring to FIGS. 1A and 1B, a method of manufacturing optical sensors according to a first embodiment of the present invention will be described.

First, a semiconductor wafer 1, which is a single-crystal silicon substrate having a plurality of pixel areas 2 formed thereon, is prepared (FIG. 1A). Photodetectors and transistors are formed in the pixel areas 2 by using a conventional semiconductor-device manufacturing process. The pixel area eventually constitutes a single optical sensor. Micro-lenses 3 are formed on an upper most surface of the semiconductor wafer 1. A wiring layer (not shown) is disposed between the semiconductor wafer 1 and the micro-lenses 3.

Figure 3:
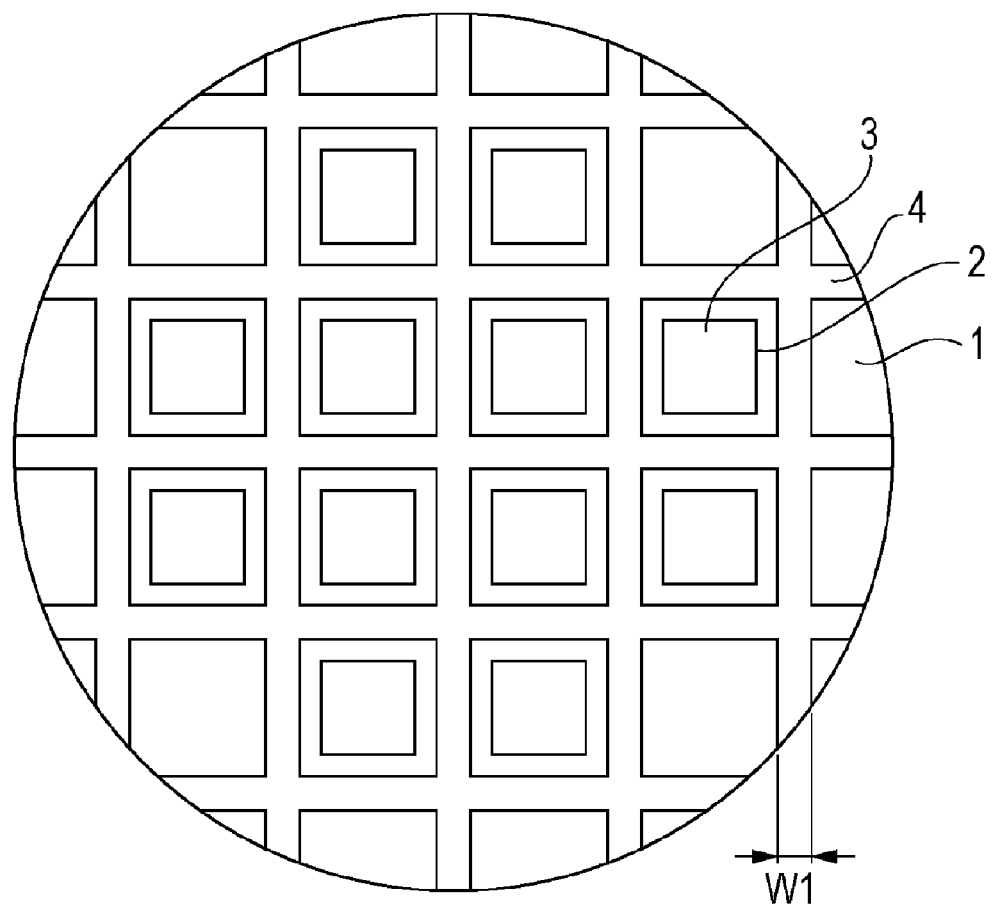
FIG. 3 is a plan view of a fixing member disposed on a semiconductor wafer according to the first embodiment.

Next, a fixing member 4, serving as a grid-like rib, is disposed on the semiconductor wafer (FIG. 1B). The fixing member 4 is disposed so as to enclose each pixel area 2 with the grid-like rib by using a method in which a photosensitive resin layer, serving as adhesive, is formed and patterned. As a method for disposing the fixing member 4, a method in which UV curable or another heat curable liquid adhesive is applied can be used. The fixing member 4 is made of an organic material. Specifically, the fixing member 4 is an adhesive material or compound, such as a UV curable liquid adhesive, a thermosetting liquid adhesive, and a sheet adhesive made of a photosensitive film, or the like. FIG. 3 is a plan view of the fixing member 4 disposed on the semiconductor wafer 1. The fixing member 4 is disposed so as to enclose the areas provided with the pixel areas 2 and micro-lenses 3. The width, W1, of the grid-like rib on the fixing member 4 is preferably from 1.0 mm to 2.0 mm to ensure the reliability of optical sensors after being diced (described below) and a reduction in size.

Figure 1C:
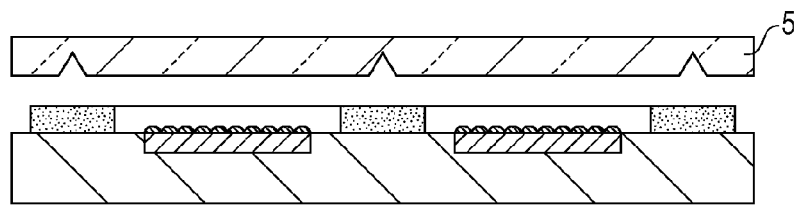
Figure 4:
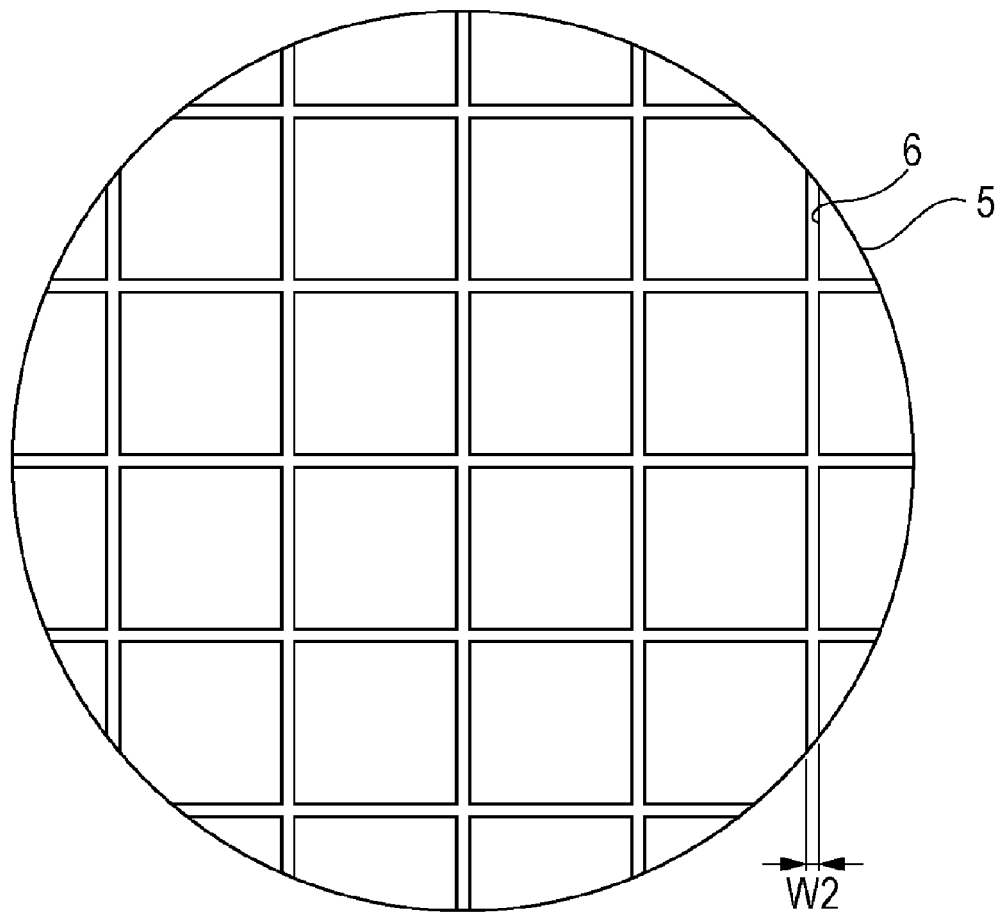
FIG. 4 is a plan view of a grid-like groove provided in a light-transmissive substrate according to the first embodiment.

Next, a light-transmissive substrate 5 having substantially the same size as the semiconductor wafer 1 and having a grid-like groove in one surface is prepared (FIG. 1C). FIG. 4 is a plan view of a grid-like groove 6 provided in the light-transmissive substrate 5. Herein, a portion surrounding grid-like areas in contact with the fixing member 4 when integrated with the semiconductor wafer 1, i.e., a portion surrounding areas corresponding to the pixel areas 2 of the light-transmissive substrate 5, is referred to as a "gap portion". The groove 6 is disposed inside the gap portion. The width, W2, of the grid-like groove 6 provided in the light-transmissive substrate 5 is preferably from 30% to 50% of the width, W1, of the grid-like rib on the fixing member 4 disposed on the semiconductor wafer 1. The light-transmissive substrate 5 is a glass substrate having a thickness of, for example, 300 μm. The depth of the groove 6 is preferably 50% or less, more preferably, 20% or less, of the thickness of the light-transmissive substrate 5 to ensure the rigidity of the light-transmissive substrate 5. The groove forming the grid extends to the edge of the light-transmissive substrate. The light-transmissive substrate 5 may be made of glass or crystal. To reduce warping, the light-transmissive substrate 5 should have a coefficient of linear expansion close to that of silicon, which constitutes the semiconductor wafer 1. For example, borosilicate glass, such as PYREX (registered trade mark) and TEMPAX (registered trade mark) may be used.

Figure 1D:
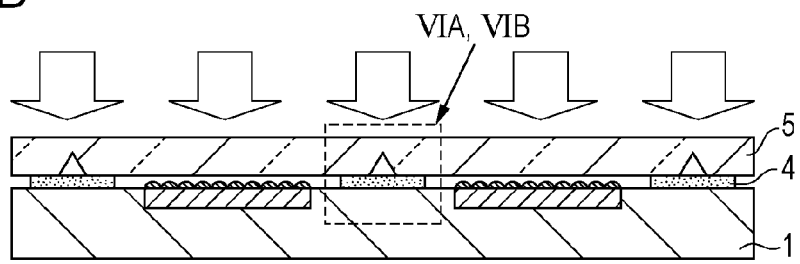
Figure 5:
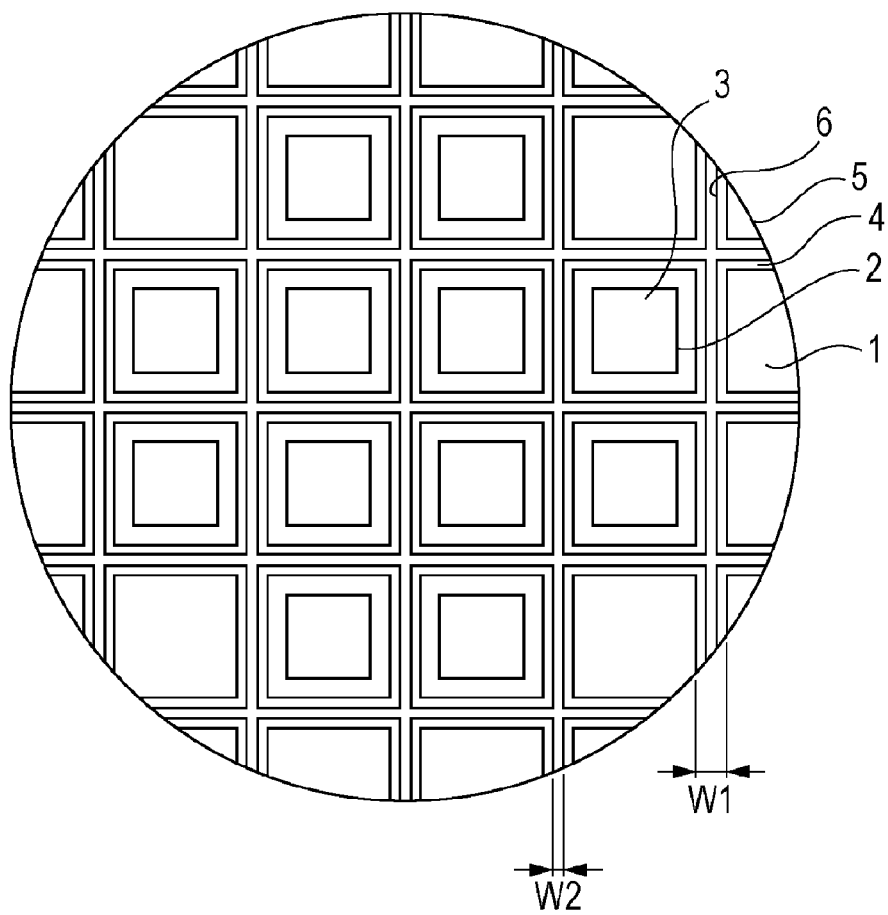
FIG. 5 is a plan view of a layered body formed of the light-transmissive substrate and the semiconductor wafer fixed to each other with a fixing member, according to the first embodiment.

Next, the light-transmissive substrate 5 and the semiconductor wafer 1 are bonded to each other with the fixing member 4 such that the surface (a main surface) of the light-transmissive substrate 5, in which the grid-like groove is formed, and the semiconductor wafer 1 face each other (FIG. 1D). FIG. 5 is a plan view of a layered body formed of the light-transmissive substrate 5 and the semiconductor wafer 1 fixed to each other with the fixing member 4. In this layered body, the groove indicated by the solid line is disposed in the area of the fixing member 4 arranged in a grid-like manner, and the groove is disposed substantially in the middle of the fixing member 4 in the width direction.

Figure 6A:
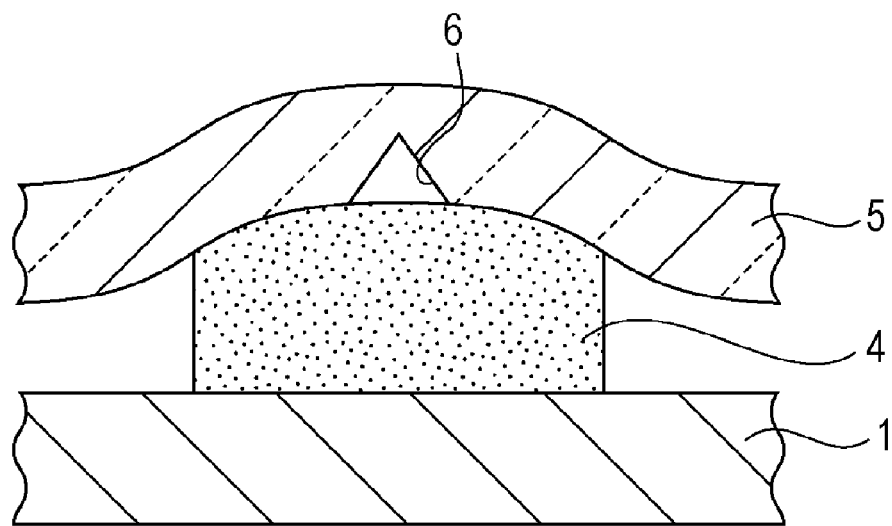
FIGS. 6A and 6B are enlarged views of a portion VIA and a portion VIB in FIG. 1D, respectively, showing the cross-section of a portion where the light-transmissive substrate and the semiconductor wafer are fixed to each other with the fixing member, according to the first embodiment.
Figure 6B:
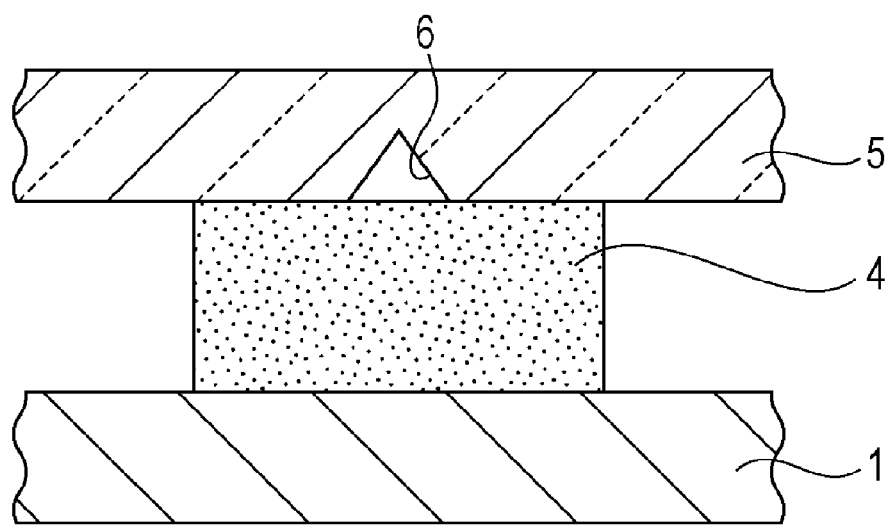

FIGS. 6A and 6B are enlarged cross-sectional views of a portion denoted by VIA, VIB in FIG. 1D. The light-transmissive substrate 5 is heated and cured while being pressed against the bonding surface of the fixing member 4, thereby being securely bonded. By being pressed, the light-transmissive substrate 5 is bonded to the fixing member 4 in a deformed state because of the fixing member 4, as shown in FIG. 6A. After the pressing is eliminated and the light-transmissive substrate 5 returns to an original state, the groove 6 serves as an airflow path communicating with the outside, as shown in FIG. 6B. Thus, no bubbles are generated between the fixing member 4 and the light-transmissive substrate 5.

Figure 7A:
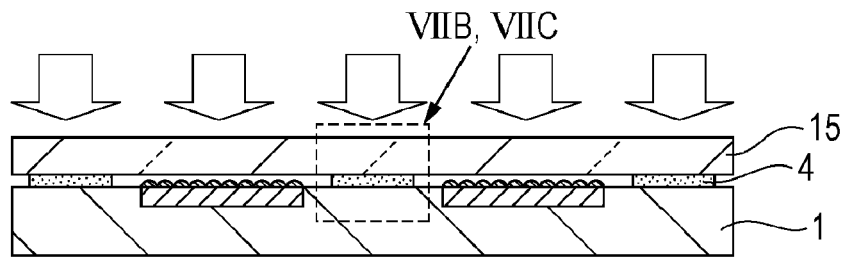
FIGS. 7A to 7C show Comparative Example, showing the cross-section of a portion where a light-transmissive substrate and a semiconductor wafer are fixed to each other with a fixing member.
Figure 7B:
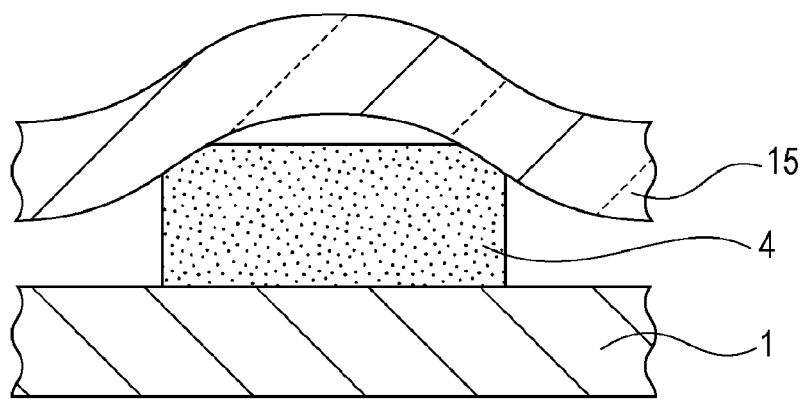
Figure 7C:
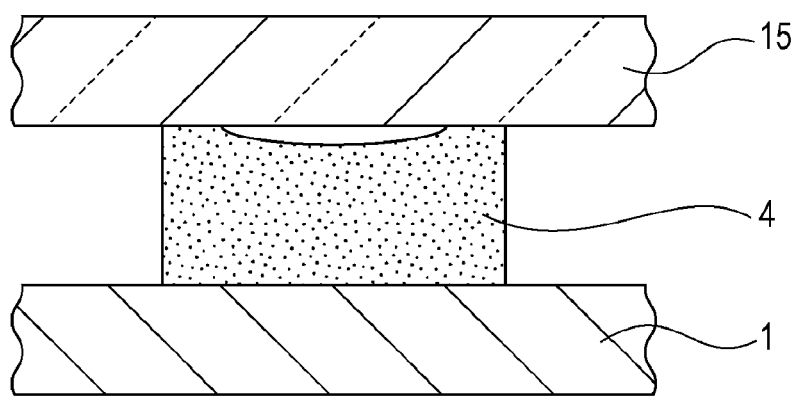

Referring to FIGS. 7A to 7C, a bonding portion between the fixing member 4 and a light-transmissive substrate 15 with no groove 6 will be described. FIG. 7A shows that the flat light-transmissive substrate 15 and the semiconductor wafer 1 are fixed to each other with the fixing member 4. FIG. 7B is an enlarged cross-sectional view of a portion denoted by VIIB in FIG. 7A, showing that the light-transmissive substrate 15 is pressed against and fixed to the bonding surface of the fixing member 4. Similarly to FIG. 6A, the light-transmissive substrate 15 is deformed because of the fixing member 4. Unlike FIG. 6A, the light-transmissive substrate 15 is bonded to the fixing member 4 with a space therebetween. After the pressing is eliminated and the light-transmissive substrate 15 returns to an original state, because there is no airflow path that allows air in the space to escape outside, bubbles are generated between the fixing member 4 and the light-transmissive substrate 15, as shown in FIG. 7C. The bubbles expand by a heat treatment in a subsequent penetrating-electrode forming step. Furthermore, gas is generated from the solvent or moisture in the adhesive, reducing the bonding area and causing separation. This decreases the yield and reliability of the optical sensors.

Figure 8A:
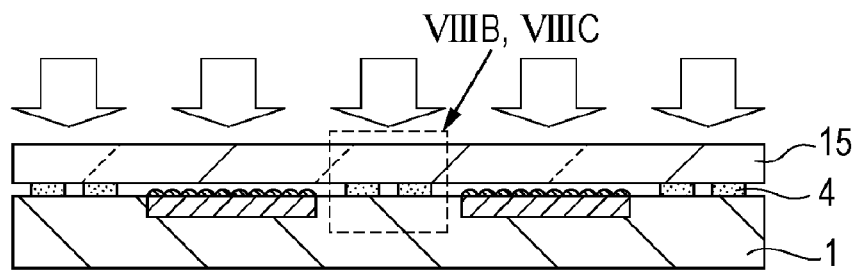
FIGS. 8A to 8C show Comparative Example, showing the cross-section of a portion where a light-transmissive substrate and a semiconductor wafer are fixed to each other with a fixing member.
Figure 8B:
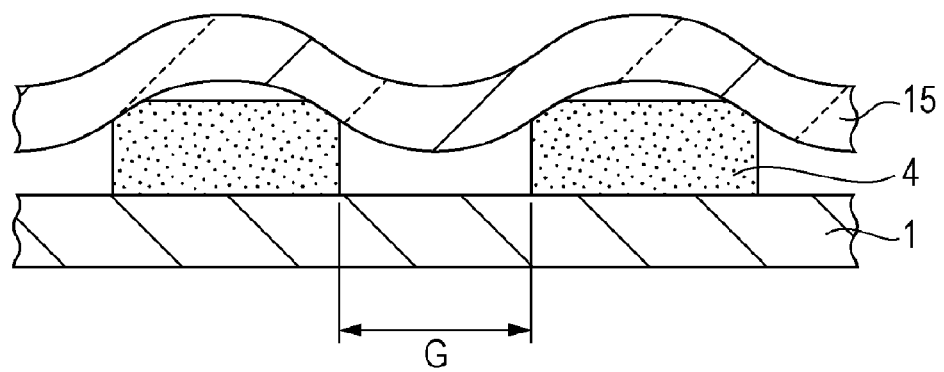
Figure 8C:
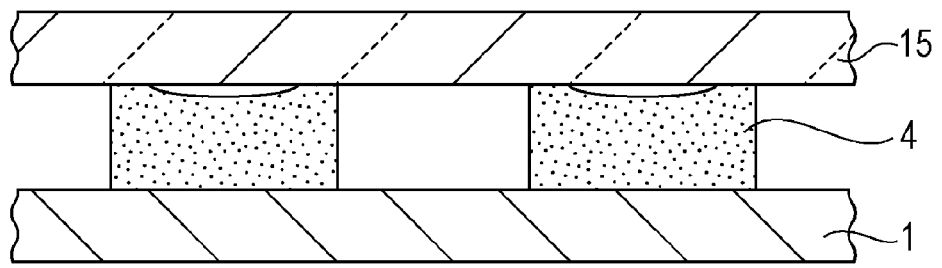

Referring to FIGS. 8A to 8C, another example of a bonding portion between the fixing member 4 and the light-transmissive substrate 15 with no groove will be described. FIG. 8A shows the flat light-transmissive substrate 15 and the semiconductor wafer 1 fixed to each other with fixing members 4 divided such that spaces G are formed in the dicing portions. FIG. 8B is an enlarged cross-sectional view of a portion denoted by VIIIB in FIG. 8A, showing that the light-transmissive substrate 15 is pressed against and fixed to the bonding surfaces of the fixing members 4. Similarly to FIG. 6A, the light-transmissive substrate 15 is deformed because of the fixing members 4. Although the distance between two fixing members 4 is about 150 μm, the light-transmissive substrate 15 and the fixing members 4 are bonded to each other with spaces therebetween, similarly to FIG. 7B. After the pressing is eliminated and the light-transmissive substrate 15 returns to an original state, bubbles are generated between the fixing members 4 and the light-transmissive substrate 15 because there is no airflow path that allows air in the spaces to escape outside, as shown in FIG. 8C. Thus, similarly to the structure shown in FIG. 7, this decreases the yield and reliability of the optical sensors.

Accordingly, by forming a grid-like groove in the light-transmissive substrate as in the present invention, bubbles generated between the light-transmissive substrate and the fixing member can be reduced. Thus, the yield and reliability of the optical sensors can be improved. The subsequent steps will be described.

Figure 2E:
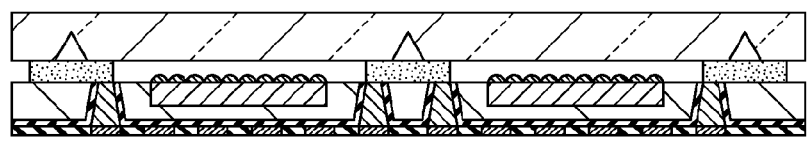
FIGS. 2E to 2H are cross-sectional views showing the process of manufacturing optical sensors according to the first embodiment.
Figure 2F:
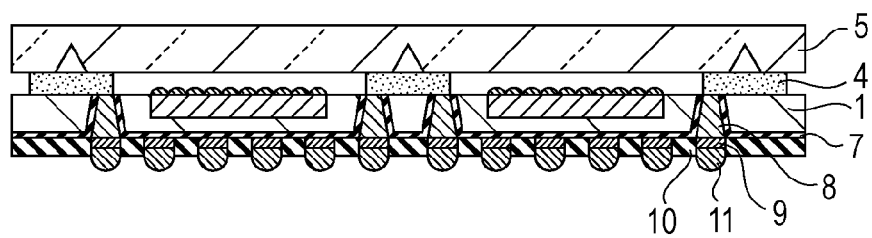

Next, the thickness of the semiconductor wafer 1 is reduced, penetrating electrodes are formed on the semiconductor wafer 1, and wiring lines and connecting terminals are formed on the surface of the semiconductor wafer 1 opposite to the light-transmissive substrate (FIG. 2E). The thickness of the semiconductor wafer 1 is reduced by at least one of back-grinding, chemical mechanical polishing (CMP), and etching. The thickness of the semiconductor wafer 1, which was 700 μm before processing, was reduced to 75 μm. A reduction in thickness of the semiconductor wafer 1 to about 100 μm makes formation of penetrating electrodes 8 easy. First, in order to provide openings in a multi-layer wiring line portion (not shown) formed on the semiconductor wafer surface, etching is performed on the semiconductor wafer 1 to provide through-holes. Then, an insulating film 7, such as a silicon oxide film, is formed. The insulating film 7 in the through-holes is etched to provide openings, which are then plated with, for example, Cu, to form penetrating electrodes 8. Wiring lines 9 are formed on the surface of the semiconductor wafer 1 opposite to the light-transmissive substrate (back surface). Then, the back surface of the semiconductor wafer 1 is covered with a solder resist serving as an insulating member 10, openings are provided on the wiring lines 9, and then soldering balls, serving as connecting terminals 11, are formed by reflowing. In the step of forming the penetrating electrodes, the layered body formed of the semiconductor wafer 1 and the light-transmissive substrate 5 is subjected to a temperature of about 200° C. during the heat treatment, generating gas due to solvent or moisture contained in the adhesive, serving as the fixing members 4. However, because the generated gas can be discharged outside through the airflow path, the bonding surfaces do not separate (FIG. 2F).

Figure 2G:
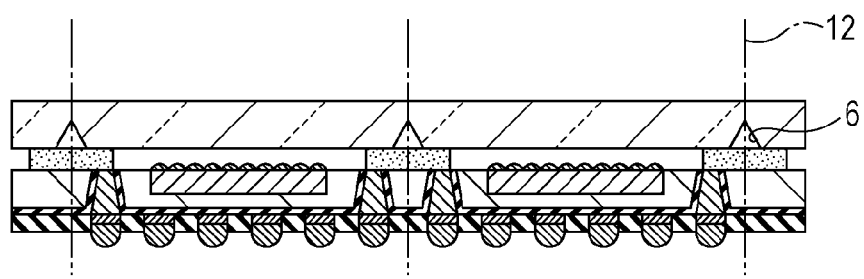

Next, the fixed semiconductor wafer 1 and the light-transmissive substrate 5 are cut into pieces such that each piece includes one pixel area (FIG. 2G). The reference numeral 12 indicates cutting positions. The method of cutting is selected from blade dicing, laser dicing, etc. The laser dicing is a suitable method because it is suitable for cutting a thinned semiconductor wafer, it can reduce the cutting width, and it can prevent burr from occurring at the cut section. By making the dicing width narrower than the width of the groove 6, the process can be simplified. When a dicing blade is used, the load applied to the blade is reduced. Because this extends the life of the blade, the cycle of replacing blade can be extended, which contributes to an improvement in the production efficiency. With the laser dicing, the processing time can be reduced.

Figure 2H:
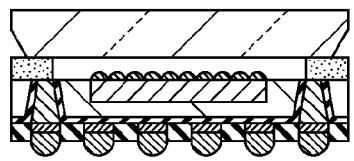

By going through the above-described steps, the optical sensors are produced (FIG. 2H). Examples of the optical sensors include CCD image sensors and CMOS image sensors.

As has been described above, this embodiment suppresses bubbles between the cover member and the fixing member for fixing the semiconductor wafer and the cover member. Thus, reliable optical sensors can be manufactured.

Second Embodiment

Figure 9A:
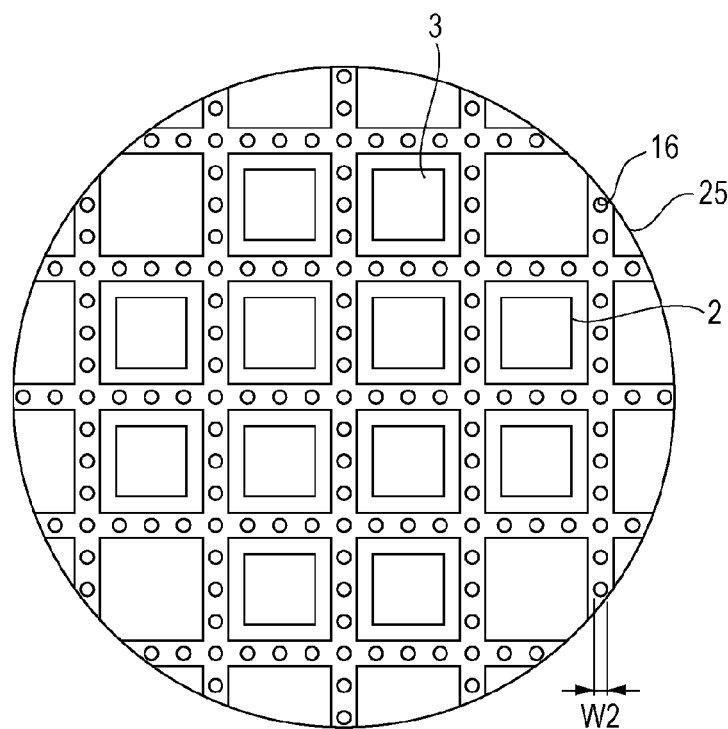
FIGS. 9A and 9B are a plan view and a cross-sectional view, respectively, of a layered body formed of a light-transmissive substrate and a semiconductor wafer fixed to each other with a fixing member, according to a second embodiment.
Figure 9B:
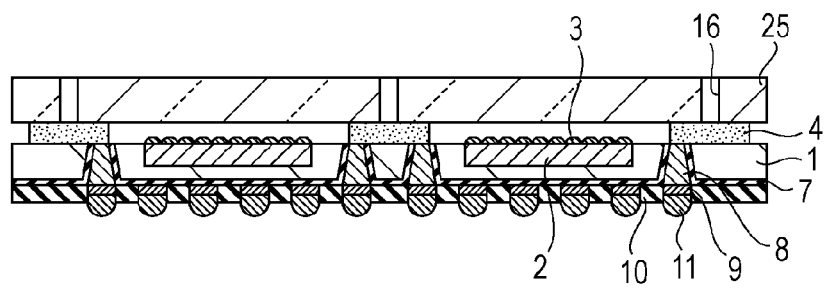

FIGS. 9A and 9B are a plan view and a cross-sectional view of a layered body formed of a light-transmissive substrate and a semiconductor wafer, according to a second embodiment of the present invention.

The second embodiment is different from the first embodiment in that the light-transmissive substrate has through-holes, not the groove portions. Because the manufacturing process is the same as that according to the first embodiment except for the structure of the light-transmissive substrate, a detailed description will be omitted. In FIGS. 9A and 9B, the structures the same as those according to the first embodiment are denoted by the same reference numerals. The structure of the light-transmissive substrate will be mainly described below.

As shown in FIGS. 9A and 9B, through-holes 16 are provided in a light-transmissive substrate 25, in the area corresponding to the fixing member 4 arranged in a grid-like manner, i.e., the gap portion. With this structure, the surface of the fixing member 4 communicates with the outside via the through-holes 16, serving as airflow paths. Thus, gas that might be generated between the light-transmissive member 25 and the fixing member 4 can be released outside through the through-holes 16, serving as the airflow paths. The width of the grid-like fixing member 4 is preferably from 1.0 mm to 2.0 mm, and the diameter, W2, of the through-holes 16 is preferably from 30% to 50% of the width of the grid-like rib, similarly to the groove portion.

With the light-transmissive substrate 25 having the through-holes, a decrease in bending rigidity of the light-transmissive substrate 25 can be suppressed, compared with the case where a groove portion continuous in the horizontal direction is provided as in the first embodiment. Accordingly, the function as the support when the semiconductor wafer 1 is thinned by back-grinding can be maintained without increasing the thickness of the light-transmissive substrate. By providing both a groove portion according to the first embodiment and the through-holes according to this embodiment, the efficiency of discharging gas to the outside can be increased.

As has been described above, also with this embodiment, bubbles between the cover member and the fixing member for fixing the semiconductor wafer 1 and the cover member can be suppressed. Thus, reliable optical sensors can be manufactured.

Although a continuous groove is provided in a grid-like manner in the first embodiment, the groove may contain some discontinuous parts. In addition, the groove does not necessarily have to have a V-shape, and the through-holes do not necessarily have to have a circular shape in plan view. The groove and the through-holes may be provided in a mixed manner, and the embodiments may be employed in combination. Although the above-described rib has a grid-like configuration, it may have any shape as long as it encloses the pixel areas, if the pixel areas are not rectangular.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-191323 filed Aug. 27, 2010, which is hereby incorporated by reference herein in its entirety.

What is claimed is:

1. A method of manufacturing an optical sensor, the method comprising the steps of:
providing a semiconductor wafer having a plurality of pixel areas;
forming a grid-like rib enclosing each pixel area on the semiconductor wafer, the grid-like rib having a predetermined width and being formed from a fixing member;
providing a light-transmissive substrate having a gap portion on a main surface thereof, the gap portion having at least one of a groove with a width smaller than the width of the grid-like rib and a plurality of through-holes with the diameter thereof being smaller than the width of the grid-like rib;
fixing the semiconductor wafer and the light-transmissive substrate such that the grid-like rib and the gap portion face each other; and
cutting the fixed semiconductor wafer and light-transmissive substrate into pieces such that each piece includes one pixel area.

2. The method according to claim 1, further comprising, after the step of fixing the semiconductor wafer onto the light-transmissive substrate and before the step of cutting the fixed semiconductor wafer and light-transmissive substrate into pieces, the step of forming penetrating electrodes in the semiconductor wafer and forming wiring lines and connecting terminals on a surface of the semiconductor wafer opposite to the light-transmissive substrate.

3. The method according to claim 1,
wherein the width of the grid-like rib on the fixing member is from 1.0 mm to 2.0 mm, and the width of the groove or the diameter of the plurality of through-holes provided in the light-transmissive substrate is from 30% to 50% of the width of the grid-like rib.

4. The method according to claim 1,
wherein the groove and the plurality of through-holes, at least one of which is disposed in the gap portion, are arranged in a grid-like manner.

5. The method according to claim 4,
wherein, in the step of cutting the fixed semiconductor wafer and light-transmissive substrate into pieces, dicing is performed along at least one of the groove and the plurality of through-holes provided in the light-transmissive substrate.

6. The method according to claim 5,
wherein the step of providing a light-transmissive substrate includes a step of providing a light-transmissive substrate having the groove, and, in the step of cutting the fixed semiconductor wafer and light-transmissive substrate into pieces, the dicing width is smaller than the width of the groove.

* * * * *